United States Patent [19]

Sinclair

[11] 4,402,563

[45] Sep. 6, 1983

[54] ZERO INSERTION FORCE CONNECTOR

[75] Inventor: William Y. Sinclair, Frenchtown, N.J.

[73] Assignee: Aries Electronics, Inc., Frenchtown, N.J.

[21] Appl. No.: 266,929

[22] Filed: May 26, 1981

[51] Int. Cl.³ .............................................. H01R 13/62
[52] U.S. Cl. .............................. 339/75 M; 339/17 CF
[58] Field of Search ............. 339/74 R, 75 M, 75 MP, 339/17 CF, 176 MP

[56] References Cited

U.S. PATENT DOCUMENTS

| 3,160,459 | 12/1964 | Greco et al. | 339/176 MP |
|---|---|---|---|
| 3,568,134 | 3/1971 | Anhalt et al. | 339/75 MP |
| 3,763,459 | 10/1973 | Millis | 339/75 M |
| 3,891,289 | 6/1975 | Hanke | 339/75 M |
| 4,054,347 | 10/1977 | Mouissie | 339/17 CF |
| 4,076,362 | 2/1978 | Ichimura | 339/75 MP |
| 4,080,032 | 3/1978 | Cherian et al. | 339/17 CF |
| 4,314,736 | 2/1982 | Demnianiuk | 339/75 M |
| 4,377,319 | 3/1983 | MacDougall | 339/17 CF |

FOREIGN PATENT DOCUMENTS

| 2252670 | 7/1975 | France | 339/75 MP |
|---|---|---|---|
| 1187949 | 4/1970 | United Kingdom | 339/176 MP |

Primary Examiner—John McQuade
Assistant Examiner—Gary F. Paumen

Attorney, Agent, or Firm—Hedman, Casella, Gibson, Costigan and Hoare

[57] ABSTRACT

A connector is disclosed for electrically interconnecting the conductive pins of an electrical component to a printed circuit board. The connector includes a plurality of conductive contacts mounted within a non-conductive housing. Each contact includes first and second upwardly extending arms spaced apart a distance sufficient to permit a conductive pin of the electical component to be freely mounted therebetween. The first arm of the contact is generally V-shaped in configuration and defines an intermediate projecting section, extending away from the second arm. A cammed closure is provided for exerting a force on the projecting section of the first arm in a direction towards the second arm. By this arrangement, after a conductive pin is mounted between the arms of the contact, the actuation of the cam causes the first arm of the contact to be moved into electrical contact with the conductive pin of the component. Further movement of the cam causes the contact point of the first arm to travel upwardly, along the conductive pin, wiping oxidation residue from the pin. In the preferred embodiment, the cam is movable to a locked position wherein the contact point of the first arm is located at a position on the conductive pin which has been wiped clean during the locking action.

9 Claims, 8 Drawing Figures

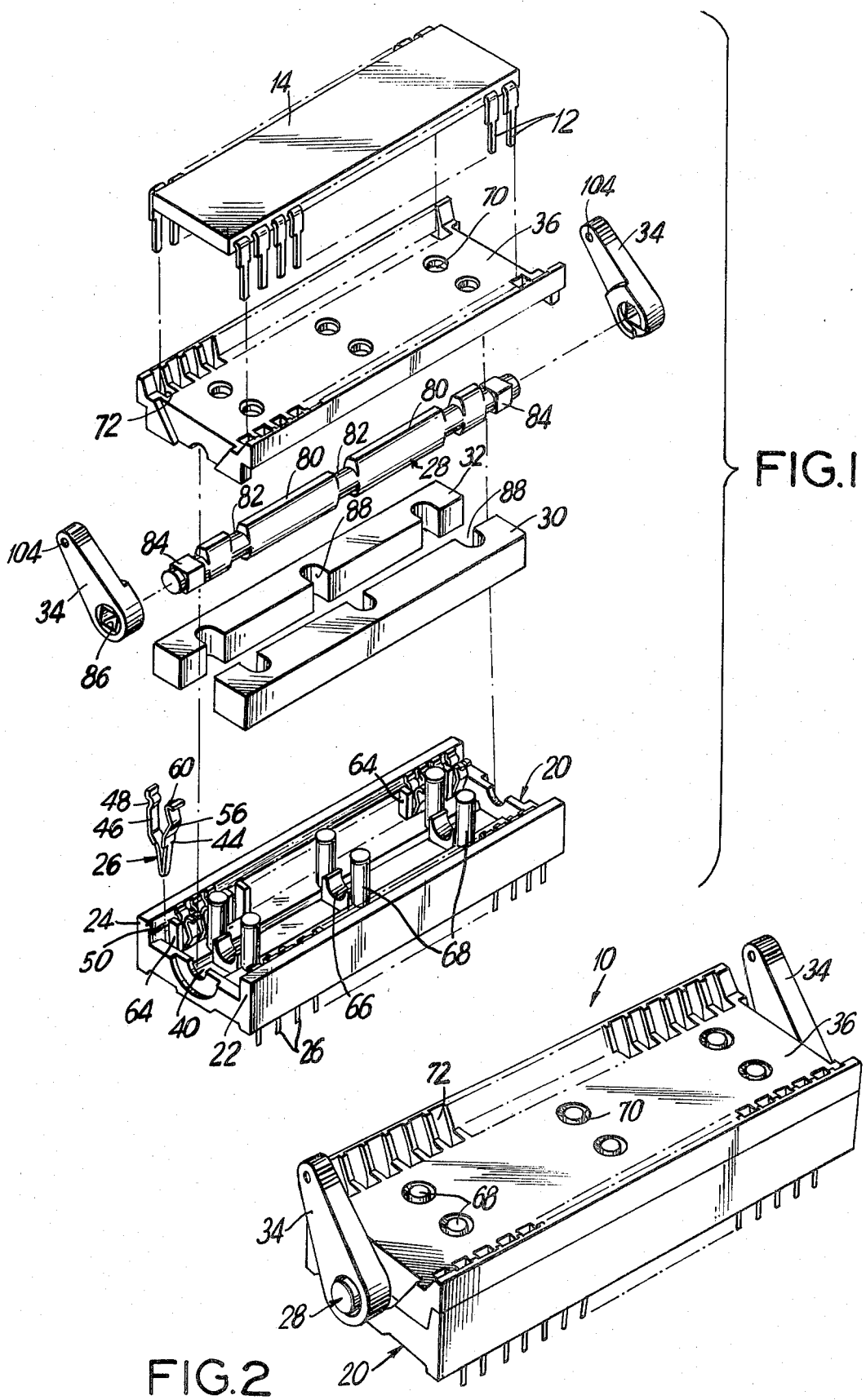

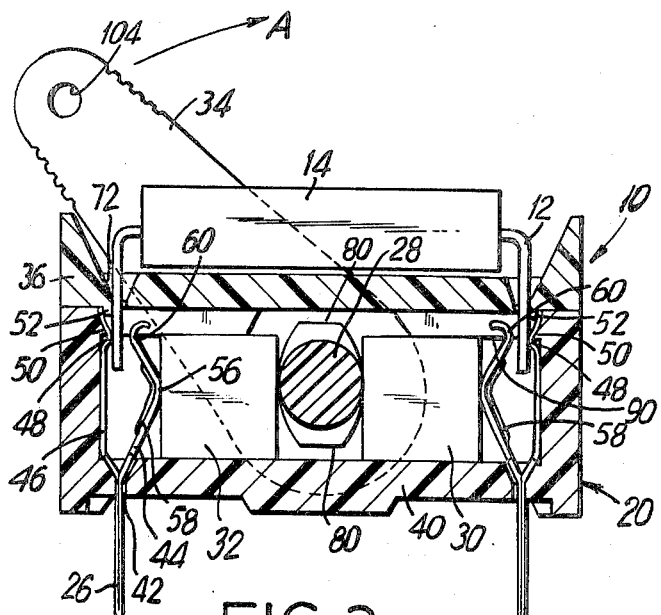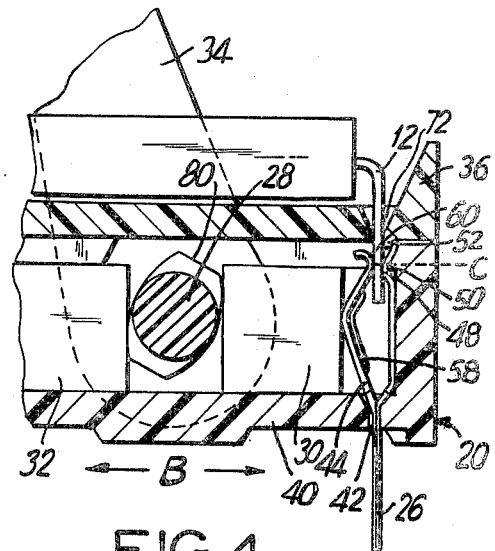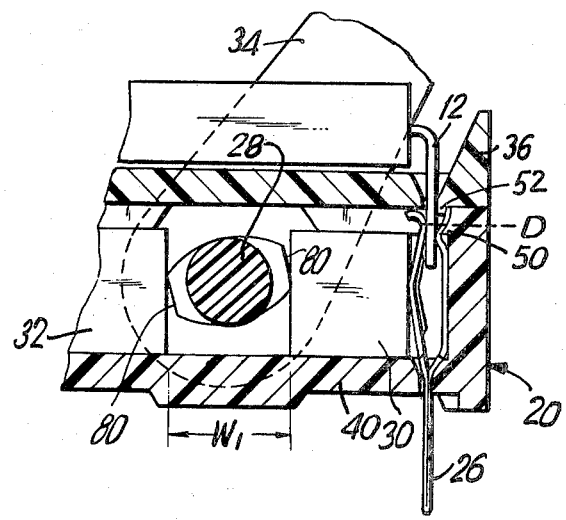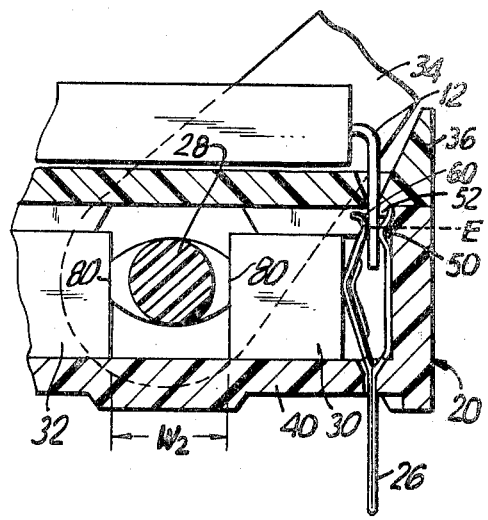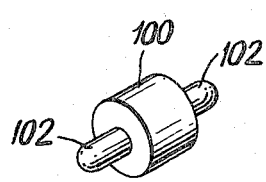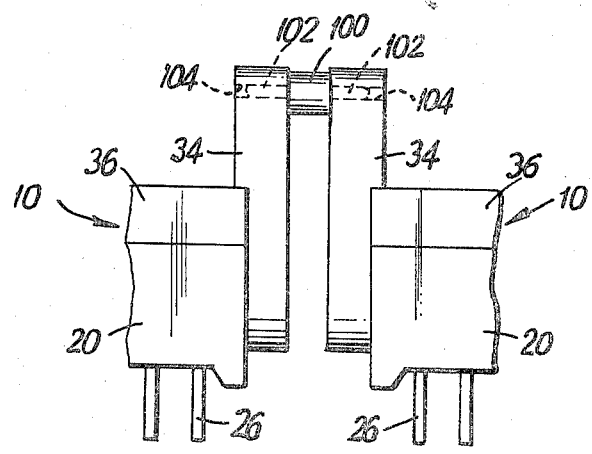

ZERO INSERTION FORCE CONNECTOR

BACKGROUND OF THE INVENTION

The subject invention relates to a new and improved electrical connector for establishing solderless connections between the conductive pins of an electrical component and a printed circuit board. More particularly, the lead pins of an electrical component can be freely mounted within the contacts of the subject connector. Thereafter, the connector can be actuated to produce secure mechanical and electrical connection.

In the prior art, a variety of electrical connectors or socket assemblies have been developed to facilitate the mounting of electrical components on printed circuit boards. The electrical connectors are generally provided with resilient contacts which are adapted to receive the conductive pins of an electrical component such as an integrated circuit package. In a relatively early embodiment, a connector was provided with contacts having resilient arms spaced apart a distance less than the thickness of the conductive pins of the component. In use, the leads of the electrical component are forcefully inserted between the arms of a contact, with the electrical connection being dependent upon the resiliency of the contact.

In many applications, the necessity of forcing the leads of an electrical component between the arms of a resilient contact is undesirable. For example, with the increasing use of dual-in-line integrated circuits, the number of leads provided on the device makes the mounting of the component in a connector more difficult. Further, the requirement of forcing the leads of the component into the spring loaded contact creates wear on the component leads and increases the likelihood of damage to the device, due to the bending or breaking of the leads.

Accordingly, in the prior art, a variety of improved connectors have been developed which are designed to reduce or eliminate the insertion force required to mount the leads of a component in the connector. Two examples of devices which satisfy this criteria are disclosed in U.S. Pat. Nos. 4,080,032, issued Mar. 21, 1978 to Cerian et al and U.S. Pat. No. 3,763,459 issued Oct. 2, 1973 to Millis. In the former patent to Cherian, a device is disclosed wherein a plurality of electrical contacts are mounted within an insulated housing. Each contact includes a pair of resilient arms which in their relaxed position, are spaced apart a distance less than the thickness of the leads of an electrical component. The connector further includes a cam assembly, which may be actuated by a tool, for spreading the arms of the contact, to achieve a spacing therebetween which is greater than the thickness of the lead of the electrical component. By this arrangement, the pins of the electrical component may be freely mounted within the connector. After the component is mounted, the actuation means is released allowing the contact to resume its relaxed position, thereby establishing electrical connections between the contacts and the pins of the component.

In the patent to Millis, a non-conductive housing is also provided having a plurality of contacts mounted therein. In the latter device, the arms of each contact are spaced apart a distance greater than the pins of the electrical component. Thus, in the relaxed position, the pins of the electrical component can be freely mounted to the connector. The latter device further includes a cammed actuator for placing a biasing force on the arms of the contact in order to force the contact into electrical engagement with the pins of the component. When it is desired to remove the electrical component, the actuator is released allowing the arms of the contact to relax thereby permitting the pins to be freely withdrawn from the connector. Thus, in both of the above discussed prior art devices, means are provided for moving the arms of contacts into and out of engagement with conductive pins to reduce or eliminate the forces required to mount an electrical component.

It is an object of the subject invention to provide a new and improved electrical connector which not only eliminates the force required to mount an electrical component, but in addition, is capable of achieving a superior electrical interconnection between the contact and the conductive pin of the component.

It is another object of the subject invention to provide a new and improved electrical connector having a unique electrical contact capable of providing an improved electrical interconnection with a conductive pin. More particularly, a connector is disclosed having a contact which when actuated, wipes the conductive pin thereby removing any residue thereon to establish a superior electrical connection.

It is a further object of the subject invention to provide a new and improved electrical connector having an improved contact assembly capable of wiping residue from a conductive pin of an electrical component and establishing an electrical connection along the cleaned area of the pin.

It is another object of the subject invention to provide a new and improved electrical connector having contacts movable to a locked position establishing a relatively high retentive force thereby preventing the degradation of the electrical connection due to vibration or other disturbance.

It is still a further object of the subject invention to provide an electrical connector wherein the contacts are positively locked within the housing thereby inhibiting the shifting of the contacts during insertion and removal of an electrical component.

SUMMARY OF THE INVENTION

In accordance with these and many other objects, the subject invention provides for a new and improved electrical connector or socket assembly for receiving an electrical component, having a plurality of conductive pins disposed in two parallel rows. The socket assembly includes a generally rectangular, non-conductive housing having a bottom wall and two opposed, upstanding side walls. A plurality of conductive pin receiving contacts are provided, mounted in the base of the housing in two spaced apart, parallel rows. Each pin receiving contact includes first and second upwardly extending arms which, in the relaxed position, are spaced apart a distance greater than the thickness of a conductive pin of an electrical component. By this arrangement, the pins of the component may be freely received therein with zero insertion force required.

The main contact points of each arm of the contact are disposed adjacent the upwardly extending free ends thereof. In accordance with the subject invention, the first arm of each contact is resilient and is generally V-shaped in configuration, with the apex of the V defining a projecting section, extending away from the second arm and towards the center of the housing. In the preferred embodiment of the subject invention, the second arm of each contact is braced against the associated side wall of the housing.

A cam actuated closure means is provided for exerting a force on the projecting section of the first arm of each contact, in the direction of the second arm. More particularly, an elongated cam means is provided which is rotatably mounted in the center of the housing. The cam is generally elliptical in cross-section having major and minor axes disposed in perpendicular relationship. A pair of cam followers are provided which are disposed between the rows of contacts on either side of the cam. To actuate the closure means, the cam is rotated causing the cam followers to move transversely and exert a force against the projecting portion of each first arm of the contact in a direction towards the second arm. The force exerted by the cam followers drives the first arm of the contact towards the mounted conductive pin until electrical contact is established between the conductive pin and the main contact points of the contact arms. Continued lateral movement of the cam followers causes the main contact point of the first arm to travel upwardly along the conductive pin in a wiping motion thereby scraping oxidation residues from the surface of the pin. As can be appreciated, the cleaning of the conductive pin functions to enhance the characteristics of the electrical interconnection.

In a preferred embodiment of the subject invention, the cam is movable to a locked position to provide a secure electrical interconnection. More particularly, the cam is provided with a pair of opposed locking flats disposed perpendicular to the major axis thereof. In order to lock the connector, the cam is rotated such that the major axis thereof is moved from a horizontal orientation towards a vertical orientation. As discussed above, the actuation of the cam causes the main contact point of the first arm to travel upwardly, wiping the surface of the conductive pin. As the rotation of the cam nears 90°, the main contact point of the first arm travels upwardly to maximum high point on the conductive pin. When the cam has been rotated the full 90°, the locking flats abut the cam followers. In this position, the main contact point of the first arm is located and locked at a point on the conductive pin below its maximum high point of travel resulting in a superior electrical connection. Stated differently, during the upward movement of the main contact point, residue on the conductive pin is scraped upwardly to a point above the maximum high point of travel. Accordingly, when the pin is allowed to return downwardly to the locked position, electrical contact is established at a point on the conductive pin which has been cleaned, thereby enhancing the electrical characteristics of the connection. In addition, the locking flats on the cam aid in maintaining the cam in the locked position increasing the retentive force on the conductive pin preventing it from coming loose due to the vibration or other disturbance. In order to release the electrical component, the cam is merely rotated back to its initial position permitting the resilient arm of the contact to move to its relaxed configuration. The separation between the arms of the contact enables the electrical component to be readily withdrawn from the connector.

Further objects and advantages of the subject invention will become apparent from the following detailed description taken in conjunction with the drawings in which:

FIG. 1 is an exploded perspective view of the new and improved electrical connector of the subject invention;

FIG. 2 is a perspective view of the new and improved electrical connector of the subject invention;

FIGS. 3 through 6 are cross-sectional views of the new and improved socket assembly of the subject invention illustrating the locking of a conductive pin within a contact;

FIG. 7 is a perspective view of a ganging pin used to coordinate the locking function of a pair of connectors mounted in alignment;

FIG. 8 is a partial elevational view illustrating the use of the ganging pin shown in FIG. 7.

DESCRIPTION OF THE PREFERRED EMBODIMENT

Referring to FIGS. 1 and 2 there is illustrated the socket assembly or electrical connector 10 of the subject invention. The connector 10 is intended to provide a solderless electrical interconnection between the conductive pins 12 of an electrical component 14 and a printed circuit board (not shown). Typically, the electrical component 14 is an integrated circuit having a dual in-line configuration, wherein two parallel rows of downwardly projecting conductive pins 12 are provided. It is to be understood that while the subject invention is shown in use with a dual-in-line integrated circuit package, the scope of the subject invention is not intended to be limited thereby. In contrast, the subject invention may be utilized in conjunction with the mounting of any conductive male members in female sockets.

The subject connector 10 includes a non-conductive housing 20 having opposed parallel upstanding side walls 22 and 24. Housing 20 is adapted to receive a plurality of contacts 26, mounted in two parallel rows adjacent the opposed side walls 22 and 24 respectively. Also mounted within the housing 20 is a rotatable cam 28, as well as a pair of cam followers 30 and 32 respectively. A pair of levers 34 are connectable to the ends of the cam 28 for actuating the cam. A cover 36 is provided for sealing the upper end of housing 20.

Referring also to FIGS. 3 through 6, the connector 10 will now be described in greater detail. Housing 20 includes a bottom wall 40 having a plurality of chamfered apertures 42 adapted to receive the lower ends of each contact 26. Each contact 26 includes first and second upwardly extending arms 44 and 46 respectively. Preferably, each contact 26 is mounted such that second arm 46 is braced against the associated side wall of the housing. As illustrated in FIG. 3, the upper end of each second arm 46 includes an inwardly directed bend 48 defining the main contact point of the arm. In accordance with the subject ivention, each wall of the housing includes a longitudinally extending detent 50 projecting inwardly therefrom and aligned with the bends 48 of the second contact arm 46. As described more fully hereinafter, the detent 50 cooperates with a downwardly projecting lip 52 of cover 36 to securely hold the contact within the housing.

The first contact arm 26 is generally V-shaped in configuration with the apex of the V defining a projecting section 56 extending away from the second arm. First arm 44 is resilient and preferably includes a central area 58 having a thickened cross-section to increase the resilience of the arm. A bend 60 is provided adjacent the upper end of the first contact arm 44 which defines the main contact point thereof. As seen in FIG. 3, the relaxed condition of the contact 26, the main contact points 48 and 60 of the arms are spaced apart a distance greater than the thickness of the conductive pin 12 of the electrical component 14.

As discussed above, each contact 26 is mounted to the base 40 of the housing 20 through an aperture 42. Preferably, the housing 20 is additionally provided with a plurality of locating rails 64, as illustrated in FIG. 1, which project inwardly from each wall 22, 24 of the housing. Rails 64 function to define discrete spaces to facilitate the initial mounting of the contacts 26 and to maintain their separation during use. The bottom wall 40 of the housing 20 is provided with a plurality of U-shaped channel members 66 to facilitate the rotational mounting of cam 28. Housing 20 further includes a plurality of locking pins 68 which project upwardly from the base and are adapted to interengage with apertures 70 provided in the top cover 36. Top cover 36 is also provided with a plurality of chamfered openings 72 disposed in two parallel rows and aligned with the contacts 26 mounted in the housing 20 as illustrated in FIG. 3.

In accordance with the subject invention, a new and improved closure means is provided which is adapted to exert a force on the projecting section 56 of the first arm 44 of the contact, in the direction of the second arm 46. As discussed more fully hereinbelow, the force exerted on the first arm causes the main contact point 60 thereof to initially come into electrical contact with the conductive pin and thereafter wipe upwardly along the surface thereof cleaning the pin of residues such as oxides.

The closure means of the subject invention includes an elongated cam 28 which, as illustrated in FIGS. 3 through 6, has a generally elliptical cross-section having major and minor axes disposed in perpendicular relationship. The cam 28 is further provided with an opposed pair of locking flats 80 which are disposed perpendicular to the major axis of the cross sectional ellipse. In the preferred embodiment of the subject invention, cam 28 includes a plurality of intermediate circular areas 82 which are aligned and received in the U-shaped channel members 66 of the housing. The U-shaped channel members 66 support the circular areas 82 of the cam 28 facilitating its rotation. Preferably, cam 28 is actuated by a lever 34. Accordingly, cam 28 is provided with generally square driving ends 84 which are receivable in a square drive aperture 86 formed in each lever 34. During the assembly of the connector 10, the levers 34 are snap fit onto the ends 84 of the cam 28 such that rotation of the lever causes the rotation of the cam. The length of the lever 34 is designed to reduce the force necessary to rotate the cam. However, it is to be noted that the lever 34 is dimensioned such that the free end thereof does not project beyond the envelope dimensions of the housing 20 thereby minimizing the space requirements of the subject connector.

The closure means of the subject invention further includes a pair of elongated cam followers 30 and 32 which are respectively mounted adjacent each of the rows of contacts, on either side of the cam 28, as illustrated in FIG. 3. Cam followers 30 and 32 are generally rectangular in cross section and in the preferred embodiment, are provided with U-shaped recesses 88 which are aligned with the upstanding pins 68 of the housing, as illustrated in FIG. 1. During the assembly of the subject connector, cam followers 30 and 32 are mounted such that the pins 68 are received in the recesses 88, thereby preventing the cam followers from shifting, along their longitudinal axis, relative to the housing. However, as can be appreciated, the cam followers 30 and 32 are free to move in a direction transverse to the longitudinal axis of the housing, in response to the movement of the cam 28.

In the assembly of the subject connector 10, the cam 28 and cam followers 30 and 32 are mounted within the housing as previously described. The contacts may then be mounted into the housing with the lower ends thereof extending through the apertures 42 in the base 40. Preferably, each row of contacts is formed in spaced relationship on a continuous strip, interconnected at the upper edge of each second arm 46. By this arrangement, the entire row of contacts may be simultaneously mounted within the housing. After the contacts are mounted, the continuous strip (not shown), interconnecting the contacts, is merely rotated and broken off, leaving a plurality of discrete contacts 26 mounted within the housing. In conventional applications, the projecting bottom ends of the contacts are connectable to a printed circuit board.

In the final assembly step of the subject connector 10, cover 36 is mounted to the housing 20 with the pins 68 projecting upwardly through the aligned apertures creating a secure interference fit therebetween. The bottom surface 90 of the cover 36 abuts the upper surface of the cam followers 30 and 32 preventing them from shifting in a vertical direction. Thus, due to the unique configuration of the housing, the movement of the cam followers is limited to a direction transverse to the longitudinal axis of the housing.

As discussed above, the cover 36 of the housing preferably includes a pair of opposed, downwardly projecting lips 52, as seen in FIGS. 3 through 6. The location of each lip 52 is fixed such that during the mounting of the cover 36, the upper end of the second arm 46 of each contact 26 is interposed between the associated side wall of the housing and the lip 52. Lip 52 cooperates with the longitudinally extending detent 50 of the housing to provide a secure interlocking configuration with the upper free end of the first arm 46. By this arrangement, the contact is positively secured within the housing and insures its alignment with the pins of the electrical component.

The connector 10, assembled in accordance with the subject invention, permits an electrical component to be freely mounted therein. The connector 10 may then be actuated to achieve a solderless electrical connection between the contacts 26 of the connector and the conductive pins 12 of the electrical component. More particularly, in the relaxed position of the contacts, as illustrated in FIG. 3, the spacing between the main contact points 48 and 60 of each contact is greater than the thickness of a pin 12 of the electrical component. Initially, cam 28 is disposed so that the major axis thereof is disposed in a horizontal orientation with the resilient first arm 44 of each contact functioning to bias the cam followers 30 and 32 into contact with the cam 28. In this condition, the component 14 may be rapidly and easily mounted, with the conductive pins being received between the arms of the associated contacts.

In accordance with the subject invention, the closure means may then be actuated to provide a secure interengagement between the contact and the pins of the electrical component. In order to actuate the closure means, lever 34 is rotated in a direction indicated by arrow A in FIG. 3. The rotation of lever 34 causes the cam to rotate in a similar direction. As illustrated in FIG. 4, as cam 28 rotates, the outer surface thereof bears on cam followers 30 and 32 in a manner to cause them to shift laterally in the direction indicated by arrows B. The cam followers 30 and 32 bear directly against the projecting section 56 on the first arm 34 of each of contact 26. The force placed on each first arm causes the main contact point 60 thereof to move into contact with pin 12 of the component 14 at point C as illustrated in FIG. 4. At this stage, an electrical connection is established between the pin 12 and the opposed main contact points 60 and 48 of the first and second arms of the contact respectively.

Further rotation of the cam 28 causes the cam followers to continue their laterally outward movement. Since the main contact point 60 of the first arm is already abutting the conductive pin 12, any further lateral movement thereof is impeded. In contrast, the continued lateral movement of the cam followers 30 and 32 causes the first arm 44 to straighten out as the main contact point 60 wipes upwardly along the conductive pin 12 as illustrated in FIG. 5. The upward wiping of the main contact point 60, functions to scrape the surface of the pin removing any deposits such as oxides or other contaminants. Removal of the residues from the pin functions to expose a clean contact surface thereby enhancing the electrical connection between the contact and the pin.

The cam followers will move outwardly from the center of the housing towards the side walls thereof under the force of the cam to a maximum point as illustrated in FIG. 5. More particularly, the maximum travel of the cam followers is defined by the maximum cross sectional width W1 of the cam. Thus, when this point in the rotation of the cam is reached, the main contact point 60 of the first arm will reach a maximum high point D on the conductive pin. Accordingly, the oxidation residue on the pin is moved upwardly to an area on the conductive pin above point D.

In the preferred embodiment of the subject invention, the closure means is then movable to a locked position to achieve a superior electrical connection. More particularly, the cam 28 is rotated to the position illustrated in FIG. 6, wherein the major axis thereof is horizontally disposed. In this position, the opposed locking flats 80 of the cam are disposed in abutting relationship with the side walls of the cam followers 30 and 32. As can be appreciated, due to the unique configuration of cam 28, the horizontal width W2 of the cam in the locked position, is less than the maximum horizontal width W1 of the cam as illustrated in FIG. 5. Accordingly, when the cam is rotated into the locked position, the resilient properties of each first arm 44 of the contacts enables the arm to revert back towards it original configuration. The biasing force of the first arm functions to move the cam followers back inwardly, maintaining their abutting relationship with the cam 28. As illustrated in FIG. 6, because the first contact arm 44 is permitted to revert back towards its initial position, the main contact point 60 thereof moves downwardly along conductive pin 12 to a point E, located below the maximum high point D. As can be appreciated, since point E is lower than point D, it is located on the conductive pin in an area which has been scraped clean of any residues. Stated differently, during the locking operation of the connector 10, main contact point 60 of the first arm wipes any residues upwardly to a maximum point illustrated at D in FIG. 5.

Thereafter, the main contact point 60 is permitted to move downwardly, into a locked position at point E, such that electrical contact is established in a cleaned area. It is to be noted that the unique wiping action, which functions to clean the conductive pin, enabling a superior electrical connection to be produced, occurs every time the subject connector 10 is actuated.

Another advantage achieved by the subject connector is that in the locked position, the retentive force placed on the conductive pin 12 of the electrical component is relatively high. More particularly, in the locked position of the connector, the conductive pin is held tightly between the arms of the contact preventing the degradation of the electrical connection due to vibration or other disturbances. As illustrated in FIG. 6, cam 28 exerts a constant pressure on the contact through the cam followers. Due to the unique configuration of cam 28, the locked position is stable, and a relatively high degree of force is necessary to initially move the cam out of the locked position back towards the unlocked position. In addition, and as illustrated in FIG. 6, in the locked position of the contact, the main contact point 60 of first arm 44 is located above the main contact point 48 of second arm 46. The vertical displacement between the main contact points functions to place a rotational moment on the conductive pin thereby increasing the withdrawal force necessary to remove the pin. For purposes of comparison, in a prior art connector, which relies on the resilient force of the contact, only one half ounce of force is required to withdraw a pin. In contrast, up to 5 ounces of force are required to withdraw a pin from a locked contact 26 in a connector 10 formed in accordance with the subject invention.

When it is desired to remove the electrical component 14 from the connector 10, the user rotates lever arm 34 and the cam 28 back to their intitial position. As cam 28 is returned to its initial position, contact 26 moves to its relaxed position with main contact point 60 traveling through a reversed motion. More particularly, main contact point 60 first travels upwardly to the maximum high point D on the conductive pin thereby further cleaning the pin of residue. Once cam 28 has been returned to the orientation as illustrated in FIG. 3, the resilient first arm 44 of the contacts 26 bias the cam followers 30 and 32 back into their initial position. In the relaxed position of the contact, the arms are spaced apart a distance greater than the thickness of the conductive pin thereby permitting the electrical component to be freely withdrawn from the connector 10.

Referring to FIGS. 7 and 8 there is illustrated a ganging pin 100 which is intended to facilitate the use of the subject connectors 10 with an in-line installation. Frequently it is desirable to mount a plurality of connectors in an in-line manner on a printed circuit board, with one end of each connector being adjacent another. In order to facilitate the locking of multiple connectors, ganging pin 100 may be utilized. Ganging pin 100 includes a generally cylindrical body portion having two rod-like projections 102 extending axially outwardly from the opposed ends thereof. Each lever arm 34 of the connector 10 is provided with an aperture 104 at the free end thereof, adapted to receive a projection 102 of the ganging pin 100. Thus, as illustrated in FIG. 8, when two connectors 10 of the subject invention are mounted in an in-line configuration, ganging pin 100 is inserted between the adjacent lever arms 34 such that the pins 102 are received in the aperture 104 thereof. A ganging pin 100 installed as described above, functions to couple the movement of the lever arms 34 of adjacent connectors. Accordingly, when the lever arm 34 of the first connector in an in-line assembly is actuated, all the coupled connectors will be simultaneously actuated. By this arrangement, a plurality of coupled connectors 10 may be locked or unlocked with the user having to rotate only a single lever arm 34.

In summary, there is provided a new and improved electrical connector 10 adapted to provide solderless electrical interconnection between the pins 12 of an electrical component 14 and the contacts 26 of the connector. The subject connector 10 includes a non-conductive housing 20 having a plurality of conductive pin receiving contacts 26 mounted in the base of the housing, in two spaced apart parallel rows. Each pin receiving contact 26 includes first and second upwardly extending arms 44 and 46 which are spaced apart a distance greater than the thickness of a conductive pin of the electrical component, enabling the conductive pins to be freely mounted therein with little or no insertion force required. In accordance with the subject invention, the first arm 44 of each contact is resilient and has a V-shaped configuration defining an intermediate projecting section 56 extending away from the second arm. A closure means is mounted within the housing for exerting a force on the projecting section 56 of each first arm in a direction towards the associated second arm. The closure means includes a rotatable cam 28 mounted between a pair of cam followers 30 and 32. The rotation of the cam causes the cam followers to move laterally in order to exert a force on the first cam of each contact. In use, after the electrical component is mounted within the connector, cam 28 is rotated such that the cam followers drive the first arms of the contact into electrical contact with the conductive pin. Continued rotation of the cam causes the main contact point 60 of the first arm 44 to wipe upwardly along the conductive pin, cleaning the pin of oxidation residues. By this arrangement, the electrical contact between the pin and the contact is enhanced. In the preferred embodiment of the subject invention, the cam is generally elliptical in cross section and includes an opposed pair of locking flats 80 disposed perpendicular to the major axis of the ellipse. The cam 28 is movable to a locked position with the major axis disposed in a horizontal orientation. In the locked position, main contact point 60 of the first arm 44 is disposed at a point E, below the maximum high point D on the conductive pin 12 such that electrical contact is established in a cleaned area on the pin. In the locked position of the connector, a relatively high retention force is achieved thereby positively securing the pins between arms of the contact. The pins can be released merely by returning the cam to its initial position.

While the subject invention has been described with reference to a preferred embodiment it is apparent that various other changes and modifications can be made herein without varying the scope and spirit of the subject invention as defined by the appended claims.

What is claimed is:

1. A connector assembly for receiving an electrical component having a plurality of conductive pins disposed in two parallel rows, said connector assembly comprising:

a generally rectangular, non-conductive housing including a bottom wall and two longitudinally extending upstanding side walls disposed in spaced parallel relationship;

a plurality of conductive pin receiving contacts mounted in the base of said housing in two spaced apart parallel rows, each pin receiving contact including first and second upwardly extending arms spaced apart a distance greater than the thickness of a conductive pin of the electrical component enabling said conductive pin to be freely received therebetween, with each said row of contacts being mounted within said housing such that each said second arm of said contacts is braced against the associated side wall of the housing, with a portion of each upwardly extending arm, disposed adjacent the free end thereof, defining the main contact point of each arm and with the first arm of each contact being resilient and configured so as to define an intermediate projecting section extending away from said second arm, with said main contact point of said second arm being defined by an arcuate bend extending towards said first arm, with each said upstanding side wall including a longitudinally extending detent aligned with said bend in said second arm and interengaged therewith to inhibit the unwanted shifting of said contact within said housing;

said housing further including a cover extending between said side walls, said cover including a pair of opposed downwardly projecting lips, said lips cooperating with said detents of said side walls for positively securing said contacts within said housing; and closure means mounted within said housing for exerting a force on the projecting section of each said first arm in a direction towards the associated second arm whereby after the conductive pins of the electrical component are freely mounted between the arms of said contacts, said closure means may be actuated such that a force is exerted on the projecting portion of each contact initially driving said first arm towards said conductive pin until electrical contact is established between said conductive pin and the main contact points of said arms and thereafter causes said main contact point of said first arm to travel upwardly along said conductive pin, said movement of said main contact point of said first arm along said conductive pin functioning to wipe the surface of said pin thereby enhancing the electrical contact therebetween.

2. A connector assembly as recited in claim 1 wherein said first arm of said contact is generally V-shaped in configuration with the apex of said V defining said intermediate projecting section.

3. A connector assembly as recited in claim 2 wherein the apex portion of each said V-shaped first arm has a cross sectional thickness greater than the remaining portions of each said first arm thereby enhancing the resiliency of each said first arm.

4. A connector assembly as recited in claim 1 wherein said closure means includes an elongated cam means rotatably mounted within said housing between said rows of contacts, said cam means being generally elliptical in cross-section, having major and minor axes disposed in perpendicular relationship, said closure means further including a pair of elongated cam follower means, each said cam follower means being respectively disposed on either side of said cam means adjacent the first arms of the contacts in one of said rows of contacts, said cam follower means being laterally movable in response to the rotational movement of said cam means whereby when said cam means is in a first position with the major axis thereof being vertically disposed, said arms of each said contact are in an open position, spaced apart a distance greater than the thickness of a conductive pin enabling said pins of said electrical component to be readily received in said contacts, and whereby as said cam means is rotated, each said cam follower means moves laterally and bears upon said projecting section of said first arms of each said contact thereby initially driving said first arm towards said conductive pin until electrical contact is established between said conductive pin and the main contact points of said arms and thereafter causes said main contact point of said first arms to travel upwardly along said conductive pin, said movement of said contact point of said first arm along said conductive pin functioning to wipe the surface of said pin thereby enhancing the electrical contact therebetween.

5. A connector assembly as recited in claim 4 wherein said closure means is movable to a locked position such that after said main contact point of each said first arm has traveled upwardly to a maximum high point on the associated conductive pin, said closure means is movable into a locked position permitting each said resilient first arm to travel downwardly into a locked position whereby the upward movement of said main contact point of each said first arm functions to wipe contaminants on the surface of the associated pin upwardly, providing a clean contact surface at the locked position for enhancing the electrical content therebetween.

6. A connector assembly as recited in claim 5 wherein in the locked position of said contact, the main contact points of said arms are vertically displaced thereby creating a rotational moment on said conductive pin for increasing the retentive force placed thereon.

7. A connector assembly as recited in claim 5 wherein said cam means is generally elliptical in cross section and includes a pair of opposed, parallel planar locking flats disposed perpendicular to the major axis of said elliptical cross section such that when said cam means is disposed in the locked position, said major axis is horizontally disposed with said locking flats abutting the adjacent cam follower means, enabling said main contact point of each said first arm to move downwardly into said locked position.

8. A connector assembly as recited in claim 1 wherein said closure means includes a longitudinally extending cam means rotatably mounted within said housing, and with said assembly further including a pair of levers connected to the opposed ends of said cam means, said levers for actuating said cam means.

9. A plurality of connector assemblies as recited in claim 8 further including a means for simultaneously actuating the plurality of said connector assemblies when said assemblies are mounted in an in-line fashion, said means including a ganging pin, said ganging pin being interconnected between levers of adjacent assemblies such that when one lever of one assembly is actuated all the coupled assemblies are simultaneously actuated.

* * * * *